United States Patent [19]

Nichols

[11] 4,178,559
[45] Dec. 11, 1979

[54] AMPLIFIER DISTORTION REDUCTION APPARATUS

[75] Inventor: Richard A. Nichols, Richardson, Tex.

[73] Assignee: Rockwell International Corporation, El Segundo, Calif.

[21] Appl. No.: 941,521

[22] Filed: Sep. 11, 1978

[51] Int. Cl.² .............................................. H03F 1/32
[52] U.S. Cl. .................................... 330/296; 330/149; 330/267
[58] Field of Search ................ 330/149, 263, 267, 296

[56] References Cited
U.S. PATENT DOCUMENTS

| 3,450,998 | 6/1969 | Greefkes et al. ...................... 330/296 |
| 3,952,260 | 4/1976 | Prochazka et al. ................... 330/149 |

*Primary Examiner*—James B. Mullins
*Attorney, Agent, or Firm*—Bruce C. Lutz; Howard R. Greenberg; H. Fredrick Hamann

[57] ABSTRACT

The use of a nonlinear device such as a diode inserted in series with the load impedance of a transistor amplifier stage will reduce even and odd order distortion and thus improve the overall linearity characteristics of the amplifier.

3 Claims, 2 Drawing Figures

AMPLIFIER DISTORTION REDUCTION APPARATUS

THE INVENTION

The present invention is generally related to electronics and more specifically related to amplifiers. Even more specifically, the invention is related to a means of reducing even and odd order distortion induced due to nonlinearity in transistor characteristics of a signal passing through an amplifier stage.

As is well-known to those skilled in the art, there are many types of distortion reduction circuits used to compensate for nonlinearities in amplifying devices. One such example of an odd order distortion reduction circuit is a Prochazka et al U.S. Pat. No. 3,952,260. However, all known distortion correction circuits including that referenced above are very complicated by comparison with the present invention. As will be realized, complexity raises cost even in the integrated circuit designs of today. Thus, it is always desirable to have as few components as possible commensurate with design objectives to be achieved.

The present invention uses the discovery that a single, nonlinear device in series with the load resistance in a given stage of a transistor amplifier will compensate for the nonlinearities of one or more stages of transistor amplification thereby reducing overall even and odd order distortion and increasing the "linearity" of the output signal with respect to the input signal.

The terms, even and odd order distortion, as used in this specification are related to the odd and even harmonics of a Fourier analysis of the distorted output signal. It can be shown, from a Fourier analysis, that the prime distortion component of an even order distortion is in fact the second harmonic in most instances. Likewise, the third harmonic is normally the prime contributor to odd order distortion. Thus, much prior art discussion of distortion occurring in amplifiers, etc., refers to second and third order distortion (since these are the prime contributors) in contradistinction to the broader terms even and odd order distortion as set forth and used in this application.

It is, therefore, an object of the present invention to provide an improved distortion reduction circuit.

Other objects and advantages of the present invention will be ascertained from a reading of the specification and appended claims in conjunction with the drawings wherein:

DETAILED DESCRIPTION

Figure 1:
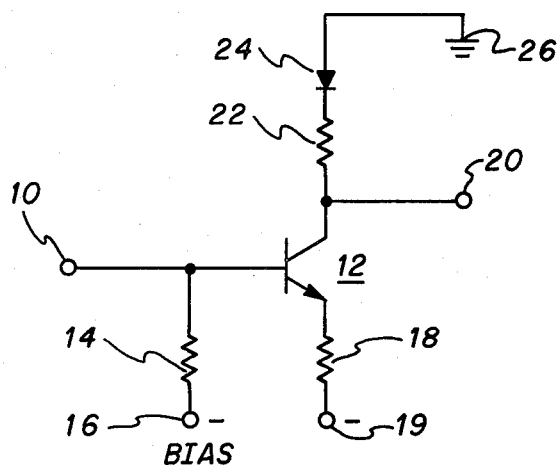
FIG. 1 is a schematic diagram of a simplified version of the circuit.

In FIG. 1 an input terminal 10 supplies input signals to a base of an NPN transistor, valve means or amplifying means 12 as well as through a bias resistor 14 to a negative potential terminal 16. A resistor 18 is connected between the emitter of transistor 12 and terminal 19. The collector of transistor 12 is connected to a signal output terminal 20 as well as being connected through a load resistor 22 and a nonlinear device, distortion product generation means, unidirectional current means, or diode 24 to ground or reference potential 26.

Figure 2:
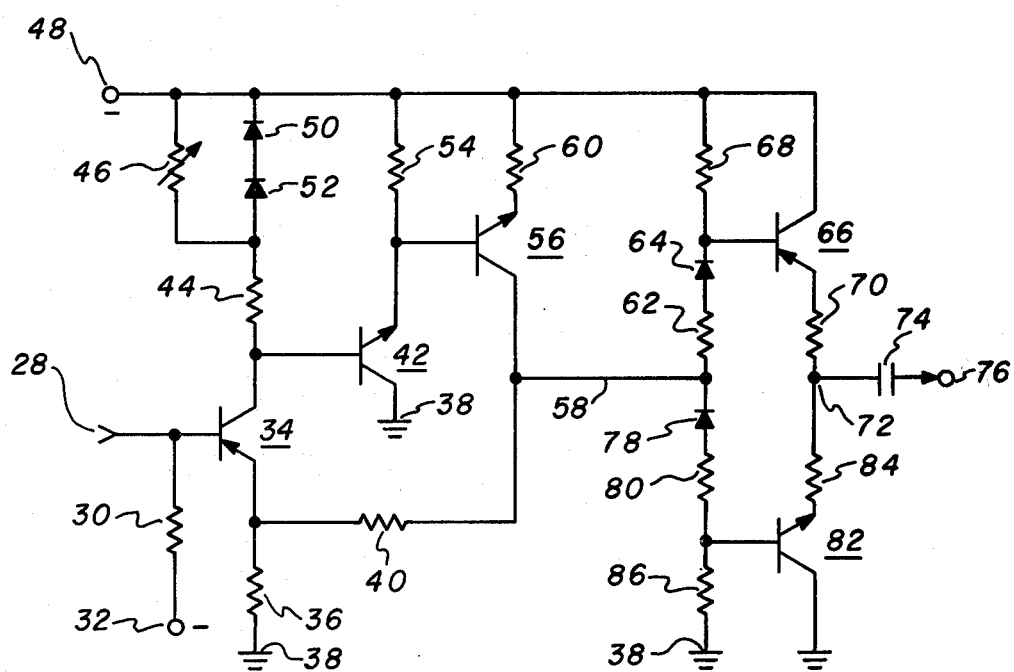
FIG. 2 is a detailed schematic diagram of one embodiment of the inventive concept as used in a three-stage feedback amplifier.

In FIG. 2 an input terminal 28 is connected through a bias resistor 30 to a source of bias potential 32. Input 28 is also connected to the base of a transistor generally designated as 34 having an emitter connected through an emitter resistor 36 to ground 38. The emitter of PNP transistor 34 is also connected to one end of a resistor 40. The collector of transistor 34 is connected to a base of a second NPN transistor 42 as well as being connected through a first resistor 44 and a second resistor 46 to a source of negative potential 48. The resistor 46, in one embodiment of the invention, is a temperature sensitive resistor to provide temperature compensation for the distortion reduction circuit. A pair of diodes 50 and 52 are connected in series while the combination is connected in parallel with resistor 46. The collector of transistor 42 is connected to ground or reference potential 38 while the emitter is connected through a load resistor or emitter follower resistor 54 to negative terminal 48. The emitter of transistor 42 is also connected to the base of a further NPN transistor 56 which has its collector connected to the other end of resistor 40 and also to a lead 58. The emitter of transistor 56 is connected through a resistor 60 to negative terminal 48. Lead 58 is connected through a resistor 62 and a diode 64 to the base of a PNP transistor 66 as well as through a resistor 68 to terminal 48. The collector of transistor 66 is also connected to terminal 48. The emitter of transistor 66 is connected through a resistor 70, a junction point 72 and through a capacitor 74 to output terminal 76. Lead 58 is also connected through a further diode 78, and a resistor 80 to a base of an NPN transistor 82. The collector of transistor 82 is connected to reference potential 38 while the emitter thereof is connected through a resistor 84 to junction point 72. The base of transistor 82 is also connected through a resistor 86 to reference potential 38.

OPERATION

The even and odd order distortion components of solid state devices are current dependent in a diode and the two different order components have their maximum effect at different current levels. Analysis of the diode distortion characteristics will show a complementary action to the distortion characteristics of the transistor when the diode is placed in the load impedance circuit of the transistor.

Turning to an examination of a specific circuit such as FIG. 1, it will be noted that a single diode 24 is used in series with the load resistance 22 for the transistor 12. With the terminal 16 being used as an independently variable bias, the operating current of transistor 12 can be varied until the right amount of current flows through diode 24 to adequately compensate for the even and odd order distortion intransistor 12. It will be noted that, while adjusting the bias current to terminal 16, the distortion can be measured by using a link analyzer such as a Hewlett-Packard 3710, which simultaneously displays the magnitude of both even and odd order nonlinearity. One application of this circuit used a type 1N4454 device for diode 24 and a transistor of the type 2N4996 for transistor 12.

The circuit of FIG. 2 is somewhat more complex. Because the amplifier comprising transistors 34, 42 and 56 is a feedback amplifier as indicated by feedback resistor 40, the current in transistor 34 was required to be constant. Thus, a pair of diodes 50 and 52 were utilized in parallel with an adjustable resistor 46. The use of adjustable resistor 46 allowed the actual current through the diodes 50 and 52 to be adjusted as a parallel impedance function and enough compensation was obtained to substantially reduce the even and odd order distortion through the amplifier circuit. Although not required as a part of the invention, it was desired that this circuit be temperature compensated and thus resistor 46 was a temperature sensitive, resistive element.

To provide even more information to one skilled in the art, the following circuit values are provided:

Transistor 34=TIS137
Resistor 36=43 Ohms
Transistor 42=2N4996
Resistor 44=1,800 Ohms
Potentiometer 46=2,000 Ohms
Diodes 50 & 52=1N4454
Resistor 54=330 Ohms
Transistor 56=2N5109
Resistor 60=43 Ohms
Resistor 40=300 Ohms As previously indicated, the prior art and in particular the Prochazka patent previously referenced, have involved very complicated circuits and have often involved these circuits in series with the signal flow thereby adding significantly to the cost of the circuit and compensation techniques required. The present invention, while very simple, performs very adequately over a very wide range of frequencies and in particular operates satisfactorily from near dc (direct current or zero frequency) to 15 megahertz. Since tubes in the form of triodes, etc., as well as diodes, have similar distortion characteristics to transistors, I wish to be limited not just to the circuit illustrated but to all comparable circuit adaptations of the present inventive concept and thus limited only by the scope of the appended claims.

I claim:

1. Transistor amplifier apparatus comprising, in combination:
    transistor means including base, emitter and collector means;
    power supply means including first and second terminal means;
    diode means and load impedance means, connected in series between said collector means and said first terminal means;
    first means connecting said emitter means to said second terminal means;
    second means for supplying input signals to be amplified to said base means of said transistor means;
    variable impedance third means connected in parallel with said diode means for adjusting the current level in said diode means whereby nonlinearities in said transistor means are compensated for; and
    output means connected to said collector means, for supplying amplified output signals.

2. Distortion reduction circuit apparatus comprising, in combination:
    valve means, having determinable distortion characteristics, including input means, common means and output means;
    power supply means including first and second terminal means;
    distortion product generation means including diode means and further means for adjusting current levels therein so that the distortion in said diode means is complementary to the distortion in said valve means;
    load impedance means;
    means connecting said distortion product generation means and said load impedance means in series between said output means of said valve means and said first terminal means of said power supply means;
    further means connecting said common means of said valve means to said second terminal means of said power supply means;
    signal means for supplying input signals to be amplified to said input means of said valve means; and
    final means, connected to said output means of said valve means for supplying substantially distortion-free amplified output signals.

3. Low distortion amplifier apparatus comprising, in combination:
    common emitter transistor amplifier means including signal input means, load impedance means and signal output means; and
    parallel connected variable impedance and diode means, connected in circuit with said load impedance means, for generating variable compensating distortion products thereby effectuating variable distortion reduction for signals passing therethrough.

* * * * *